US006221478B1

(12) United States Patent
Kammeyer

(10) Patent No.: US 6,221,478 B1
(45) Date of Patent: Apr. 24, 2001

(54) SURFACE CONVERTED GRAPHITE COMPONENTS AND METHODS OF MAKING SAME

(76) Inventor: James Kammeyer, 2575 NW. Graham Cir. P.O. Box 280, Troutdale, OR (US) 97060

( * ) Notice: Subject to any disclaimer, the term of this patent is extended or adjusted under 35 U.S.C. 154(b) by 0 days.

(21) Appl. No.: 09/122,355

(22) Filed: Jul. 24, 1998

Related U.S. Application Data
(60) Provisional application No. 60/053,579, filed on Jul. 24, 1997.

(51) Int. Cl.[7] .................................................. B32B 3/26
(52) U.S. Cl. .................................. 428/307.7; 428/310.5; 428/319.1
(58) Field of Search ....................... 428/307.7, 319.1, 428/310.5

(56) References Cited

U.S. PATENT DOCUMENTS

| | | |
|---|---|---|
| 2,992,127 | 7/1961 | Jones . |
| 3,936,535 | 2/1976 | Boder . |
| 4,188,750 | 2/1980 | Lohr . |
| 4,194,028 | 3/1980 | Sirtl et al. . |
| 4,366,191 | 12/1982 | Gistinger et al. . |
| 4,477,493 | 10/1984 | Parkinson et al. . |
| 4,564,496 | 1/1986 | Gupta et al. . |
| 4,565,711 | 1/1986 | Pinkhasov . |
| 4,711,666 | 12/1987 | Chapman et al. . |
| 4,737,348 | 4/1988 | Levin . |
| 4,751,067 | 6/1988 | Levin . |
| 4,753,763 | 6/1988 | Tanaka et al. . |
| 4,786,524 | 11/1988 | Ardary et al. . |
| 5,017,527 | 5/1991 | June-Gunn et al. . |
| 5,019,426 | 5/1991 | Noe et al. . |
| 5,037,588 | 8/1991 | Farthing et al. . |
| 5,045,398 | 9/1991 | Levin . |
| 5,207,992 | 5/1993 | Matsuo et al. . |
| 5,275,983 | 1/1994 | Schwartz et al. . |
| 5,304,417 | 4/1994 | Zurecki et al. . |
| 5,366,686 | * 11/1994 | Mortensen et al. ................ 419/5 |
| 5,405,517 | 4/1995 | Lampkin . |
| 5,476,679 | 12/1995 | Lewis et al. . |
| 5,554,204 | 9/1996 | Kotaka et al. . |
| 5,683,281 | 11/1997 | Metter . |

\* cited by examiner

Primary Examiner—Blaine Copenheaver
(74) Attorney, Agent, or Firm—Klarquist Sparkman Campbell Leigh & Whinston, LLP

(57) ABSTRACT

The present invention converts the regions of the graphite components in a CZ apparatus that are most prone to erosion to silicon carbide, forming a protective treatment (or "coating"). The coating may cover the entire component or preselected areas of the component. The resulting coating slows erosion of the graphite component and prolongs the lifetime of the component. The method of the invention includes applying a silicon-containing paste to a graphite (or other carbon) component and heating the component so that the silicon combines with carbon from the graphite component to form a protective coating. The paste is preferably a mixture of a silicon-containing powder and a carbon-containing liquid.

18 Claims, 2 Drawing Sheets

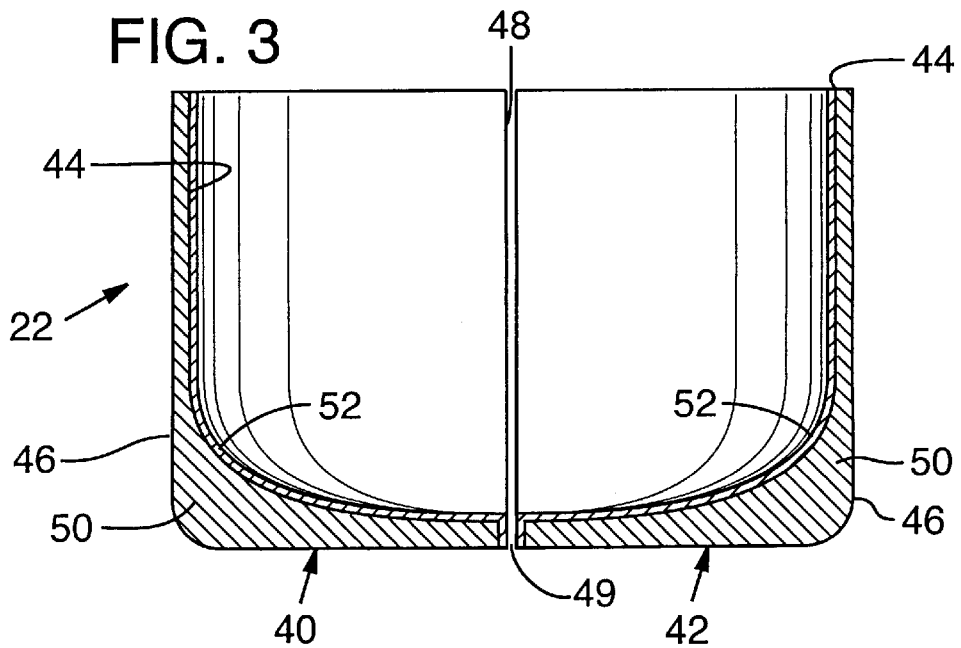
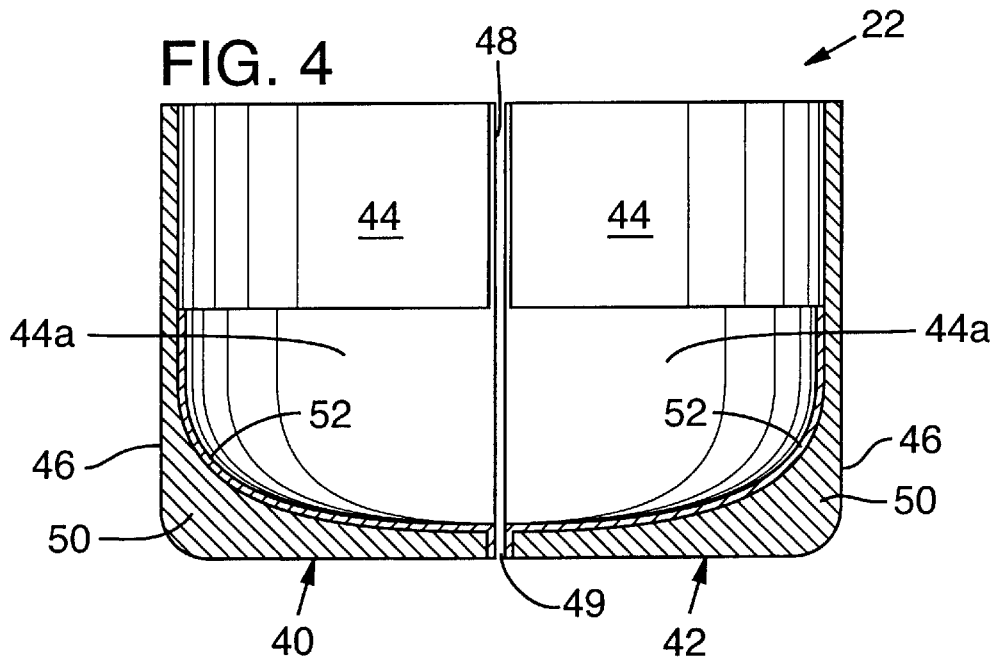

SURFACE CONVERTED GRAPHITE COMPONENTS AND METHODS OF MAKING SAME

This application claims benefit of U.S. Provisional Application No. 60/053,579, filed Jul. 24, 1997.

FIELD OF THE INVENTION

The present invention relates to graphite components of apparatus used to form semiconductor ingots and particularly, to graphite components having a protective coating and methods for making the same.

BACKGROUND OF THE INVENTION

Silicon wafers for use in the semiconductor industry are produced by a variety of methods. One such method is the Czochralski or "CZ" method. In the CZ method a silicon seed crystal of known orientation is immersed in a molten pool of silicon. The seed crystal triggers solidification of the silicon as a single crystal. As the crystal is mechanically pulled upward from the pool, the molten silicon solidifies to form an ingot. Typically, argon gas flows downwardly through the CZ apparatus to cool the solidifying crystal and to blow impurities away from the molten silicon. Silicon wafers can be manufactured from the solid ingot by machining and polishing.

A specifically constructed apparatus is used to accurately control the various parameters needed to ensure that high-quality crystals are produced. The CZ apparatus includes a crucible to hold the molten silicon. Such crucibles are typically made of fused silica (quartz). Fused silica has a high melting point and thermal stability, and is relatively non-reactive with molten silicon. However, during higher temperature melt-in periods the fused silica crucible becomes soft. Near the melting point of silicon, the crucible becomes so soft that it requires the support of a heat resistant and rigid outer crucible ("susceptor"). The susceptor and other components in a CZ apparatus that are subjected to high temperatures are typically fashioned from graphite because of its high temperature capability, relative chemical inertness, and its cleanliness properties, specifically freedom from metallic impurities. Other CZ apparatus components made from graphite include, e.g., pedestals upon which the susceptors sit, heater elements, spill trays, gas flow components, and heat shields.

The contact between the quartz crucible and the graphite components, during the crystal growing process, limits the lifetime of the graphite components. That is, at temperatures around the melting point of silicon (1410° C.), silicon oxide (SiO) gas evolves from the quartz crucible. The SiO gas causes chemical reactions to occur with the graphite susceptor and other graphite or carbon components in the CZ apparatus that are in contact with the gas. Oxygen from the SiO gas erodes the graphite, forming, inter alia, carbon monoxide (CO) and carbon dioxide ($CO_2$). CZ components used in producing other crystals, such as compound semiconductors (e.g., GaAs), typically do not encounter this erosion reaction because of the absence of silicon and oxygen-containing gases within the apparatus.

Silicon, on the other hand, combines with graphite to form silicon carbide (SiC). In certain regions of the graphite susceptor, the reaction whereby Si and graphite convert to SiC predominates, and a durable SiC surface is naturally formed by the process. In other regions, due to a variety of factors, such as the direction and velocity of gas flow in the CZ apparatus, a graphite-erosion reaction is favored. As the graphite components erode, they eventually cease to be useful and must be replaced. Particularly, erosion of the graphite typically thins the walls and floor of the susceptor, weakening those areas to the point whereby failure by cracking may occur. Additionally, such erosion may cause a void or cavity to be formed in the susceptor. Such a void or cavity may allow the quartz crucible to bulge into the susceptor to the extent that the crucible may rupture. Failure of the susceptor and/or the crucible poses a significant safety hazard. Particularly, spillage of the molten silicon through the apparatus may result in equipment damage or serious injury to the operators of the apparatus. Due to these detrimental and costly effects of erosion of the graphite susceptor and other carbon CZ components, the components, particularly the susceptors, are generally replaced after a limited period of use rather than risk the deleterious effects of erosion.

Coatings have been applied to the surface of the graphite components. For example, in U.S. Pat. No. 5,476,679 (Lewis et al.) a method for forming a glassy carbon coating on a susceptor is disclosed. The coating is formed to prevent contamination of the molten silicon by metallic impurities that may be contained within the graphite susceptor. Although this glassy carbon coating adequately blocks impurities contained within the susceptor from entering the crystal growing environment, it has been found that such a carbon coating does not fully protect susceptors against the effects of the erosion and conversion reactions just described. Moreover, the method disclosed in the Lewis et al., patent does not allow a protective coating to be formed on only the portions of the susceptor most likely to suffer from erosion but, rather, requires the entire susceptor be coated, thus requiring more coating material than would be necessary to protect the susceptor from erosion. Furthermore, parts that are fully coated are not easily evacuated and undergo a slow out-gassing behavior during the operation. Such behavior causes "virtual leaks" that behave like actual vacuum leaks and cause a loss in production time.

Silicon-carbide coatings have been applied to graphite components using conventional chemical vapor deposition (CVD) techniques. This method has been very successful for applications such as crystal epitaxy where temperatures are usually below 1000° C. For CZ susceptors, such CVD coatings tend to crack or delaminate after limited use. One explanation for this may be that the deposition temperature for the CVD coating is usually lower than the operating temperature of the CZ apparatus. Due to a difference in the coefficient of thermal expansion between graphite and silicon carbide, at CZ operating temperatures a tensile stress is created within the coating and a sheer stress is created between the graphite and the coating. This results in cracking and delamination of the coating from the carbon component when heated. Moreover, CVD is expensive, and partial coating of components using CVD would require expensive and time consuming masking procedures.

Accordingly, there is a need for protective coatings on graphite components wherein such coatings are durable, inert, highly resistant to heat, and may be applied or formed in a relatively inexpensive and simple manner on all or part of the component surface.

SUMMARY OF THE INVENTION

The present invention provides graphite components wherein regions of the graphite components' surfaces that are most prone to erosion are converted to silicon carbide before use in the crystal growing environment, and methods for manufacturing the same. A preferred method of the present invention provides a protective treatment ("coating") on a CZ susceptor or other graphite component. The coating may cover the entire surface of the component or selected areas of the component, preferably those areas most susceptible to significant erosion. Partially coated graphite components may be provided by the method of the present invention, without the necessity of masking as required with CVD methods, and the relatively high costs associated with CVD coating methods and other similar methods. An advantage of partial coating is that air contained within the pore volume of the carbon or graphite article may be easily evacuated at the onset of a crystal growing operation to avoid virtual leaks.

Further, a preferred method of the present invention uses the high-purity materials that are essential for semiconductor ingot manufacture. Accordingly, the lifetime of graphite susceptors, or other graphite components of the present invention, is extended Additionally, by use of the graphite components of the present invention, carbon contamination of the silicon melt used to make the ingots is lessened because coated graphite components do not emit significant amounts of graphite dust particles, as uncoated graphite components typically do.

A preferred method of the present invention generally comprises the steps of applying a silicon-containing paste to a selected surface area of a graphite component. The silicon-containing paste preferably comprises a mixture of a silicon-containing powder and a carbon-containing liquid. The component is then heated so that silicon in the paste melts and reacts with carbon on the surface of the graphite component, converting the graphite to form a protective SiC coating. Because the SiC coating is formed, at least in part, from a reaction of the silicon with the carbon from the graphite component, a continuum from the graphite component to the SiC coating, is formed. The continuum, as opposed to a definite border between the graphite and SiC, prevents delamination of the coating.

The SiC coating of the graphite components according to the present invention slows the erosion reaction experienced during use, e.g., during ingot production, enhancing the lifetime of the component. Additionally, the present invention provides such coated-graphite components utilizing a relatively inexpensive and simple method of manufacture.

The foregoing and other objects, features, and advantages of the invention will become more apparent from the following detailed description of preferred embodiments which proceed with reference to the accompanying drawings.

BRIEF DESCRIPTION OF THE DRAWINGS

FIG. 3 is a sectional view taken along line 3—3 of FIG. 2.

FIG. 4 is a vertical sectional view of a susceptor according to a second embodiment of the coated graphite component of the present invention.

DETAILED DESCRIPTION

Figure 1:
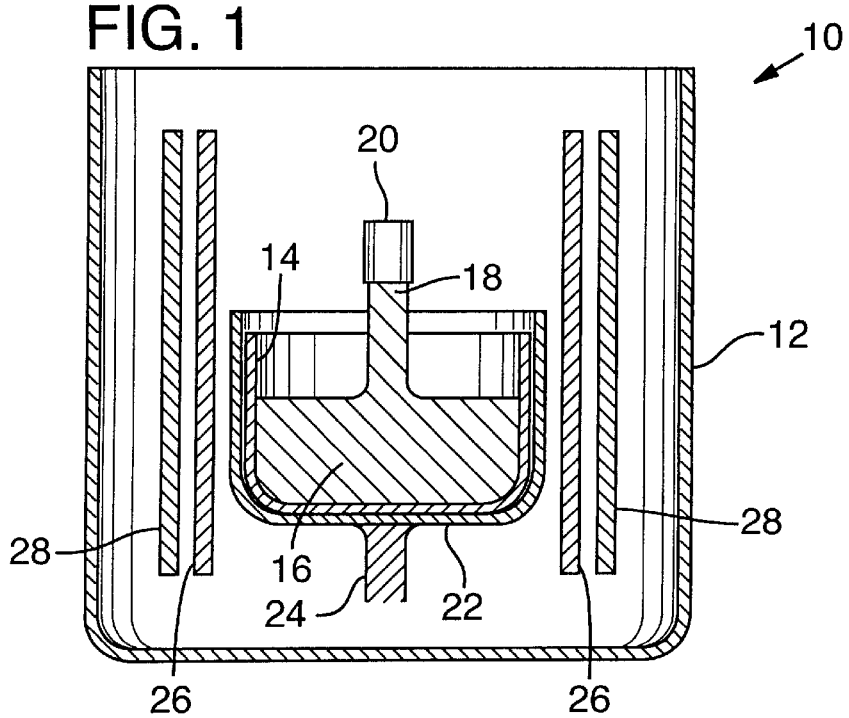
FIG. 1 is a vertical sectional view of a Czochralski apparatus for manufacture of silicon ingots.

Referring to FIG. 1, a typical CZ apparatus 10 is housed within a package 12. The CZ apparatus 10 generally includes a crucible 14 for holding molten silicon 16. The crucible 14 is preferably made of fused silica (quartz). A silicon seed crystal 18, in contact with the molten silicon 16, is secured to a chuck 20.

The crucible 14 is supported by a susceptor 22. The susceptor 22 is, in turn, typically supported by pedestal 24.

Heaters 26 are disposed within the package 12, but are preferably separated from the package by insulation (not shown). Heat shields 28 are also positioned between the heaters 26 and the package 12 to maintain the temperature within the crucible 14. It should be appreciated that the coated graphite components of the present invention provide advantageous results using a variety of CZ apparatus, not just the apparatus shown in FIG. 1.

Although the present invention is primarily described with reference to CZ susceptors, it is understood that the present invention includes a variety of coated graphite components for use with CZ apparatus or other ingot manufacturing apparatus employing graphite components. Further, although the present invention is described with reference to a protective "coating," the coating is formed, at least in part, by a surface conversion of the graphite component to silicon carbide. Accordingly, a continuum from within the graphite component to the "coating" is formed.

Figure 2:
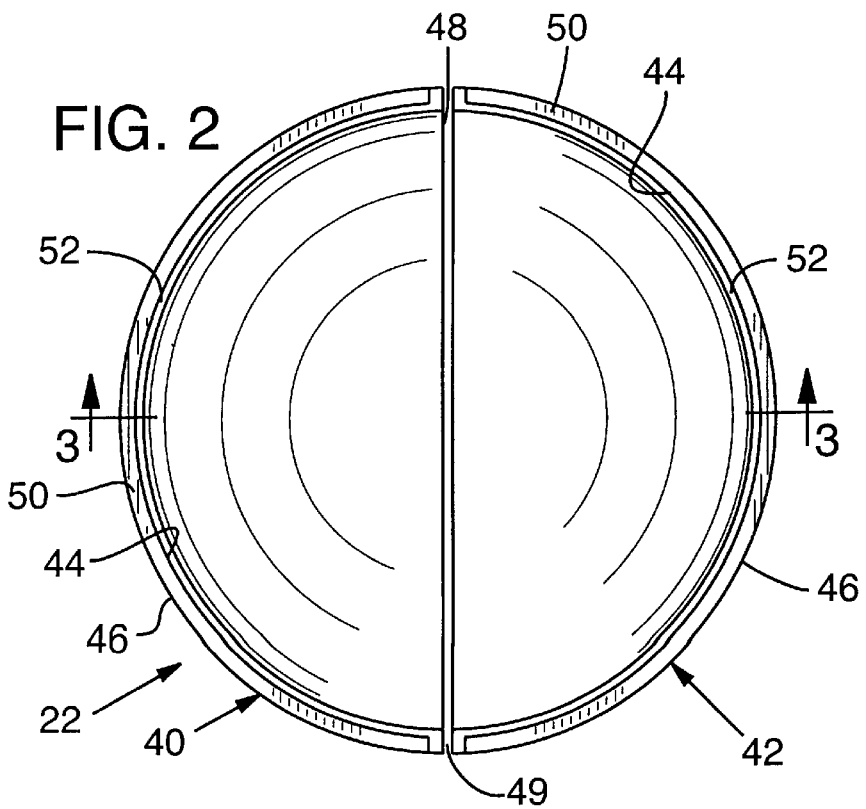
FIG. 2 is a top plan view of a SiC coated graphite susceptor according to a first embodiment of the coated graphite component of the present invention.

Referring to FIGS. 2 and 3, a first embodiment of the susceptor 22 of the present invention preferably includes susceptor portions 40, 42. Each susceptor portion 40, 42 comprises a carbon component 50 and a protective coating 52. The carbon component 50 is preferably graphite. However, the coating of the present invention may also produce advantageous results when applied to carbon components other than graphite, such as carbon-carbon composite components.

In the first embodiment of the graphite component of the present invention, the protective coating 52 on the susceptor 22 preferably covers selected regions of the carbon component 50 (i.e., the protective coating does not cover the outer surface of the susceptor).

Susceptor portions 40, 42 include inner surfaces 44. The inner surfaces 44 are shaped and sized to support a crucible 14 (FIG. 1). Each susceptor portion 40, 42 of the susceptor 22 further includes outer surfaces 46 and edges 48. The portions 40, 42 are preferably separated by a expansion gap 49. The edges 48 define the walls of the expansion gap 49. The expansion gap 49 allows the susceptor portions 40, 42 to expand and contract during heating and cooling without significantly changing the dimensions of the susceptor 22. Moreover, upon cooling, graphite susceptor 22 shrinks around the quartz crucible 14, since the coefficient of thermal expansion of quartz is very low compared to graphite. If the susceptor 22 did not have the expansion gap 49, large stresses could be created between the crucible 14 and the susceptor as components cooled. The expansion gap 49 allows the susceptor portions 40, 42 to move outwardly to prevent creation of such stresses. However, those skilled in the art will appreciate that the present invention will also produce advantageous results with other susceptor embodiments, for example, those susceptors having a horizontal cut rather than a vertical cut.

Referring to FIG. 4, the regions experiencing the highest degree of erosion during crystal growth are lower portions 44a of the inner surfaces 44 and the edges 48 of susceptor portions 40, 42. Without being tied to any particular theory, a possible explanation for the increased degree of erosion in the lower portions 44a of the inner surfaces 44 is that the crucible 14 typically becomes plastic and stretches during use. As the crucible stretches, the crucible typically comes into intimate contact with the lower portions 44a of the inner surfaces of the susceptor 22 (see FIG. 1). The intimate contact of the crucible 14 with the lower portions 44a of the susceptor 22 exposes those surfaces of the susceptor to increased concentrations of SiO gas. The SiO causes an increase in the rate of the erosion reaction.

A possible explanation of the increased degree of erosion of the edges 48 of the susceptor 22 may be due to the fact that the edges function substantially as vents for the SiO gas escaping from the susceptor 22. More specifically, as argon gas flows in a downward direction from above the crucible 14, SiO gas is pulled along the edges 48 of the susceptor 22. Thus, the edges 48 are also exposed to increased concentrations of SiO gas, resulting in an increase in the rate of erosion.

In the first embodiment of the susceptor 22 illustrated in FIGS. 2 and 3, the coating 52 covers substantially the entire inner surfaces 44 and the edges 48 of the susceptor. Coating the entire inner surfaces 44 may help to strengthen the susceptor 22 (FIG. 4).

In a second embodiment of the coated-graphite component of the present invention, shown in FIG. 4, the coating 52 covers only the edges 48 and the lower portions 44a of the inner surfaces 44 of the susceptor. That is, only those surface areas typically experiencing the highest degree of erosion are coated. The second embodiment of the present invention minimizes the amount of coating material needed since the coating is not applied to the entire inner surface 44 of the carbon component 50.

In a third embodiment of the coated-graphite component of the present invention, the coating covers the entire susceptor 22, i.e., both the inner and the outer surfaces. The third embodiment is functional, but more coating material is required (as compared to the embodiments described above) without providing known significant advantages.

Referring back to FIGS. 2 and 3, the coating 52 preferably comprises a high-purity silicon carbide (and/or a high-purity silicon nitride). The silicon carbide advantageously is formed, at least in part, by conversion of the graphite surface of the carbon component 50. Thus, a continuum is formed between the coating 52 and the carbon component 50.

In a first embodiment of the method of the present invention, the coating 52 is formed by applying a silicon-containing paste to the inner surface of a carbon component 50. The carbon component 50 is then heat treated such that the silicon reacts with the carbon ("graphite") of the carbon component to form a continuum from the graphite component to the coating 52. This is done by using a paste that comprises a carbon-containing liquid mixed with a high-purity silicon-containing powder.

More specifically, the carbon-containing liquid brings the silicon-containing powder into suspension, and, upon heating, provides a glassy or amorphous carbon. That is, the carbon-containing liquid preferably has a carbon-yield weight percent of at least about 10%. A variety of carbon-containing liquids will work, as long as the liquid contains carbon, and upon heating, the remainder of the liquid vaporizes, leaving an amorphous carbon.

A carbon-yield weight percent lower than about 10% is functional for use in the present invention, but would not be as effective as those liquids possessing a higher carbon-yield percent. Preferably, the carbon-containing liquid has a minimum amount of metallic impurities, such as boron, iron, etc. In a preferred embodiment of the present invention, the carbon-containing liquid is furfuryl alcohol, such as the furfuryl alcohol available from Aldrich in Milwaukee, Wis. Furfuryl alcohol is preferable because it has a high carbon-yield percent and because the carbon left after the remainder of the liquid vaporizes is amorphous carbon having a low permeability. However, furfuryl alcohol has some disadvantages, e.g., it is toxic and is easily absorbed through the skin or by respiration. Accordingly, alternatively, other carbon-containing liquids may be used, such as isopropyl alcohol, phenolic resin, polyvinyl alcohol, and polyamid imide.

The carbon-containing liquid is useful as it tends to convert to glassy carbon upon heating, which prevents evaporation of the silicon during the heat treatment, allowing the molten silicon to convert the graphite in the component to SiC. Additionally, the carbon-containing liquid helps to fill the pores of the graphite component and to produce glassy carbon and SiC therein. When the liquid fills the pores of the graphite component, it produces a continuum between a carbon component and the coating. This continuum helps to prevent delamination of the coating.

The silicon-containing powder is preferably a high-purity silicon powder, to avoid transfer of impurities from the coating to silicon ingots grown in the CZ apparatus 10. A particularly useful silicon powder possesses a purity of at least about 99.999%. Other silicon-containing materials may be used that produce high-purity silicon upon heating. For example, a sol-gel process could be used to produce hydrous silica, which could then be reacted to produce pure silicon.

Additionally, the silicon powder preferably has a maximum particle size of less than about 66 microns in diameter, and, more preferably, less than about 3 microns in diameter. It is advantageous for the average particle size of the silicon powder to be sufficiently small such that silicon intrudes into the pores of the graphite component prior to melting (during the heat treatment). This is desirable so that more of the silicon will enter into the pores and combine with the carbon component to better form a continuum between the carbon component and the coating. However, the silicon powder may be of any particle size, as long as the silicon powder can be made into a paste, as described below, and/or will adhere to the graphite component to be treated. In a preferred embodiment, the silicon powder is 325 mesh silicon metal, which is typically 99.999% pure available from Cerac Specialty Inorganics in Milwaukee, Wis.

The carbon-containing liquid is added to the silicon powder in a non-contaminating container. Alternatively, the powder may be added to the liquid. The powder and liquid are then mixed until a low-viscosity paste is formed. For example, the viscosity of the paste may be about twice the viscosity of the carbon-containing liquid. Preferably, the paste will be sufficiently thick such that the paste will not run off the component when applied thereto. In the first embodiment of the method of the present invention, the paste prefereably comprises one part silicon powder to two parts carbon liquid. It is also notable that the carbon-containing liquid may be left out altogether, with just the silicon powder being applied to the graphite component. However, it may be difficult to apply the silicon powder, since it must be rubbed into the pores, and glassy carbon will not be formed in the absence of the carbon-containing liquid.

The paste may be applied to all or selected portions of the graphite component using a clean, gloved hand, a non-contaminating spatula, a clean synthetic brush, or other suitable application means known to those persons skilled in the art. When the carbon-containing liquid is not added to the silicon powder to make a paste, the silicon powder may be rubbed into the pores of the graphite. Rubbing the mixture on the graphite component ensures that the paste or the silicon powder moves into the pores of the graphite to eventually form SiC therein. The paste is generally applied substantially uniformly over the portion of the graphite component to be coated. If the paste is too thick, the coating may flake off after it has been heat treated. However, if the paste is too thin, the eventually formed coating will be too thin to adequately protect the carbon component. In a preferred embodiment, a single coat of paste is applied using a synthetic brush. When the coating is applied to the surface of a graphite component, a portion of the paste will typically be absorbed into the pores.

Heat treatment of the graphite component having paste applied thereon is preferably conducted at or above the melting point of silicon (about 1410° C.). A temperature range of from about 1410° (the melting point of silicon) to about 2200° C. (temperature at which SiC decomposes) is acceptable. Preferably, the temperature is from about 1600° C. to about 1900° C., with a temperature of about 1800° C. providing especially good results. The paste-coated component is heated for a time period of from about 0.1 to about 100 hours, preferably at least about 1 hour. After heat treatment, the completeness of the coating, i.e., the altered surface of the graphite component, may be viewed by eye or by an optical or scanning-electron microscope.

The component is preferably heated in a vacuum furnace in a non-oxidizing atmosphere to avoid oxidizing the graphite of the component. Oxidation of the graphite tends to erode the component. The furnace atmosphere preferably comprises a non-oxidizing gas, such as argon (Ar), helium (He), nitrogen ($N_2$), ammonia ($NH_3$), or mixtures thereof. Alternatively, oxidizing gases, such as carbon monoxide (CO), silicon oxide (SiO), or mixtures thereof, may be used. Both $N_2$ and $NH_3$ gases have been found to be especially useful for practicing the present invention. Specifically, by introducing a nitrogen-containing gas to the furnace (e.g., $N_2$, $NH_3$), nitrogen combines with the silicon to form silicon nitride. Thus, a composite of silicon carbide and silicon nitride is formed on and within the graphite component.

Pressure inside the vacuum furnace is preferably maintained to be lower than ambient, so that furnace lids or doors are securely held in place by the pressure differential, preventing leaks. However, pressure within the furnace may be from about $10^{-8}$ torr to about 10 atm. The pressure is preferably from about 10 torr to about 760 torr; a pressure of about 650 torr providing especially good results, since it is below ambient pressure, but is not difficult to maintain.

The component may subsequently receive treatment to apply a top layer of pyrolytic carbon, CVD SiC or other CVD ceramic coating having a coefficient of thermal expansion compatible with that of graphite, depending upon the ultimate application of the graphite component. However, CVD SiC tends to delaminate when used above the deposition temperature as described above.

Although the invention has been described with reference to specific embodiments, it should be apparent to those of ordinary skill in the art that the arrangement and details disclosed herein may be modified without departing from the spirit and scope of the invention. Therefore, I claim all such modifications as fall within the scope and spirit of the following claims and all equivalents thereto.

What is claimed:

1. A CZ component for use in a CZ apparatus to produce semiconductor ingots, wherein the CZ apparatus includes a crucible for holding molten silicon, the CZ component comprising:

a porous carbon component having a first surface;

silicon carbide at least partially infiltrated pores of the carbon component; and a relatively thin layer of a protective silicon carbide formed on the surface of the carbon component, wherein the layer of protective silicon carbide forms a gradient with the silicon carbide infiltrated into the pores of the carbon component and with at least a portion of the carbon component first surface.

2. The CZ component of claim 1, wherein the component is a susceptor and the first surface of the carbon component is an inner surface shaped and sized to support the crucible.

3. The CZ component of claim 2, wherein the layer of protective silicon carbide further comprises silicon nitride.

4. The CZ component of claim 3, wherein the layer of protective silicon carbide covers only a portion of the first surface of the carbon component.

5. The CZ component of claim 3, wherein the layer of protective silicon carbide covers the entire first surface of the carbon component.

6. The CZ component of claim 1, wherein the carbon component comprises graphite.

7. A susceptor for use in a CZ apparatus to produce semiconductor ingots, wherein the CZ apparatus includes a crucible for holding molten silicon, the susceptor comprising:

a porous carbon component having an inner surface suitable for supporting the crucible;

silicon carbide at least partially infiltrated pores of the carbon component; and a relatively thin layer of a protective material formed on the inner surface of the carbon component, wherein the layer of protective material forms a gradient with the silicon carbide infiltrated into the pores of the carbon component and with a portion of the inner surface of the carbon component.

8. The susceptor of claim 7, wherein the carbon component comprises graphite.

9. The susceptor of claim 7, wherein the layer of protective material comprises silicon carbide.

10. The susceptor of claim 9, wherein the layer of protective material further comprises silicon nitride.

11. The susceptor of claim 10, wherein the layer of protective material covers only a portion of the inner surface of the carbon component.

12. The susceptor of claim 10, wherein the layer of protective material covers the entire inner surface of the carbon component.

13. A susceptor for use in a CZ apparatus to produce semiconductor ingots, wherein the CZ apparatus includes a crucible for holding molten silicon, the susceptor comprising:

a porous carbon component having an inner surface suitable for supporting the crucible; and a relatively thin layer of a protective material formed on only a portion of the inner surface of the carbon component, wherein the layer of protective material forms a gradient with the portion of the inner surface of the carbon component.

14. The susceptor of claim 13, wherein the carbon component comprises porous graphite.

15. The susceptor of claim 14, further comprising silicon carbide formed in pores of the porous graphite component.

16. The susceptor of claim 15, wherein the layer of protective material comprises silicon carbide.

17. The susceptor of claim 16, wherein the layer of protective material further comprises silicon nitride.

18. A susceptor for use in a CZ apparatus to produce semiconductor ingots, wherein the CZ apparatus includes a crucible for holding molten silicon, the susceptor comprising:

a carbon component having an inner surface suitable for supporting the crucible; and a relatively thin layer of a protective material formed on only a portion of the inner surface of the carbon component, wherein the layer of protective material forms a continuum with the portion of the inner surface of the carbon component, and the protective material comprises silicon carbide and silicon nitride.

* * * * *